United States Patent
Shakeri et al.

(10) Patent No.: US 7,859,899 B1
(45) Date of Patent: Dec. 28, 2010

(54) NON-VOLATILE MEMORY AND METHOD OF OPERATING THE SAME

(75) Inventors: Kaveh Shakeri, Campbell, CA (US); Kavin Jaejune Jang, Santa Clara, CA (US); Helmut Puchner, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 186 days.

(21) Appl. No.: 12/079,802

(22) Filed: Mar. 28, 2008

(51) Int. Cl.
*G11C 14/00* (2006.01)

(52) U.S. Cl. .................. 365/185.08; 365/218; 365/226; 365/149; 365/185.29; 365/241

(58) Field of Classification Search ............ 365/185.08, 365/218, 226, 149, 185.29, 241, 185.01
See application file for complete search history.

(56) References Cited

U.S. PATENT DOCUMENTS

| | | | |
|---|---|---|---|
| 4,571,709 A * | 2/1986 | Skupnjak et al. ....... | 365/189.08 |
| 5,327,385 A | 7/1994 | Oyama | |
| 5,477,485 A | 12/1995 | Bergemont et al. | |
| 5,586,073 A | 12/1996 | Hiura et al. | |
| 5,774,400 A | 6/1998 | Lancaster et al. | |
| 6,285,586 B1 | 9/2001 | Lung et al. | |
| 7,085,170 B2 | 8/2006 | Mihnea et al. | |
| 7,110,301 B2 | 9/2006 | Lee et al. | |
| 7,164,608 B2 | 1/2007 | Lee | |
| 7,336,534 B2 | 2/2008 | Jung | |
| 7,355,897 B2 | 4/2008 | Hsu et al. | |
| 2004/0008557 A1* | 1/2004 | Perner et al. ................ | 365/211 |
| 2008/0043516 A1* | 2/2008 | Dalton ....................... | 365/154 |

FOREIGN PATENT DOCUMENTS

WO    WO 94/10686 A1    5/1994

OTHER PUBLICATIONS

USPTO Notice of Allowance for U.S. Appl. No. 11/644,196 dated Jan. 30, 2008; 7 pages.
USPTO Notice of Allowance for U.S. Appl. No. 08/772,970 dated Oct. 15, 1997; 2 pages.
USPTO Non-Final Rejection for U.S. Appl. No. 08/772,970 dated Jun. 11, 1997; 4 pages.
USPTO Requirement for Restriction/Election for U.S. Appl. No. 08/772,970 dated Apr. 23, 1997; 3 pages.

(Continued)

*Primary Examiner*—Thong Q Le

(57) ABSTRACT

Non-volatile (NV) semiconductor memories and methods of operating the same to reduce or eliminate a need for an external capacitance are provided. In one embodiment, the memory includes a memory cell comprising a random access memory (RAM) portion and a NV memory portion, and the method comprises steps of: (i) initially erasing the NV memory portion; and (ii) on detecting a drop in power supplied to the memory, programming the NV memory portion with data from the RAM portion while powering the memory from a capacitor. On restoration of power data is recalled from the NV memory portion into the RAM portion, and the NV memory portion erased. Preferably, the capacitor is integrally formed on a single substrate with the NV memory portion and RAM portion. More preferably, the capacitor comprises intrinsic capacitance between elements of the memory formed on the substrate. Other embodiments are also disclosed.

19 Claims, 4 Drawing Sheets

OTHER PUBLICATIONS

Miyawaki et al., "A New Erasing and Row Decoding Scheme for Low Supply Voltage Operation 16-Mb/64-Mb Flash Memories," IEEE Journal of Solid-State Circuits, vol. 27, No. 4, Apr. 1992, pp. 583-588; 6 pages.

Momodomi et al., "An Experimental 4-Mbit CMOS EEPROM with a NAND-Structured Cell," IEEE Journal of Solid-State Circuits, vol. 24, No. 5, Oct. 1989, pp. 1238-1243; 6 pages.

Lundstrom et al., "Properties of MNOS Structures," IEEE Journal of Solid-State Circuits, vol. ED-19, No. 6, Jun. 1972, pp. 826-836; 11 pages.

Nozaki et al., "A -1Mb EEPROM with MONOS Memory Cell for Semiconductor Disk Application," IEEE Journal of Solid-State Circuits, vol. 26, No. 4, Apr. 1991, pp. 497-501; 5 pages.

Suzuki et al., "A Low Voltage Alterable EEPROM with Metal-Oxide-Nitride-Oxide Semiconductor (MONOS) Structures," IEEE Journal of Solid-State Circuits, vol. ED-30, No. 2, Feb. 1983; 7 pages.

Svensson et al., "Trap-Assisted Charge Injection in MNOS Structures," Journal of Applied Physics, vol. 44, No. 10, Oct. 1973, pp. 4657-4663; 7 pages.

S.M. Sze, "Physics of Semiconductor Devices," Wiley-Interscience, 1969, SBN: 471842907, pp. 425-437; 9 pages.

* cited by examiner

NON-VOLATILE MEMORY AND METHOD OF OPERATING THE SAME

TECHNICAL FIELD

The present invention relates generally to non-volatile semiconductor memories, and more particularly to non-volatile random access memory and methods of operating the same to reduce or eliminate the need for an external capacitor.

BACKGROUND OF THE INVENTION

Non-volatile static random access memory (nvSRAM) is a type of semiconductor memory that is capable of storing the data, even when the memory is not powered. Referring to FIG. 1, a conventional nvSRAM 100 comprises a plurality of nvSRAM cells 102, each including an SRAM portion 104 for storing data during normal operations when the memory is powered, and a non-volatile memory portion 106 including a number of charge storing or memory transistors with a charge storage layer capable of retaining data after power has been removed and, once power is restored, reprogramming the SRAM portion. The nvSRAM 100 further comprises control circuitry or a controller 108 to control erase, program, and recall or read operations of the non-volatile memory portion 106 to copy data from the SRAM portion 104 to the non-volatile memory portion.

The copying of data from the SRAM portion 104 to the non-volatile memory portion 106 on a drop or loss of power ($V_{CC}$) to the nvSRAM is referred to as an autostore operation. One problem with conventional nvSRAMs and methods of operating or driving the same is that a large, external electrolytic capacitor 110 is required during an autostore operation to provide power to erase and then program the non-volatile memory portion 106 of the cells to store data from the SRAM portion 104. The external capacitor 110 increases the size, complexity and cost of the nvSRAM 100.

Accordingly, there is a need for non-volatile memory and method of operating the same that reduces the size of or eliminates entirely the need for an external capacitor to power the memory the during an autostore operation.

SUMMARY OF THE INVENTION

The present invention provides a solution to these and other problems, and offers further advantages over conventional non-volatile random access memories and methods of operating the same.

In a first aspect, the present invention is directed to a method of operating a non-volatile (NV) semiconductor memory comprising at least one NV memory cell including a random access memory (RAM) portion and a non-volatile memory portion. Generally, the method includes steps of: (i) initially erasing the NV memory portion; and (ii) on detecting a drop in power supplied to the NV semiconductor memory from a power supply, programming the NV memory portion of the NV memory cell with data from the RAM portion while powering the NV semiconductor memory from a capacitor. The step of initially erasing the NV memory portion can be performed by a manufacturer prior to delivering the NV semiconductor memory to a user, or by the user. On restoration of power, data is recalled from the NV memory portion into the RAM portion and the NV memory portion erased. The NV memory portion can be erased immediately following the recalling of data from the NV memory portion into the RAM portion or anytime thereafter prior to detecting another drop in power supplied to the NV semiconductor memory.

In one preferred embodiment, the NV semiconductor memory is part of an integrated circuit or an integrated NV semiconductor memory, and the capacitor is integrally formed on a single, common substrate with the NV memory portion and RAM portion of the NV memory cell. More preferably, wherein the NV semiconductor memory is an integrated NV semiconductor memory and wherein the capacitor comprises intrinsic capacitance formed between elements of the integrated NV semiconductor memory.

The NV memory portion can include, for example, a number of charge storing transistors comprising a charge storage layer capable of retaining data after power has been removed. In one version of this embodiment, the charge storing transistors comprise a Silicon-Oxide-Nitride-Oxide-Silicon (SONOS) dielectric gate stack including a silicon-nitride or silicon-oxynitride charge trapping layer.

The RAM portion can include, for example, a number of static random access memory (SRAM) cells each comprising an SRAM latch, a high/low state of which is programmed or stored in the NV memory portion.

In another aspect, the present invention is directed to an integrated circuit or an integrated NV semiconductor memory comprising at least one NV memory cell including a RAM portion and a NV memory portion, and formed on a single, common semiconductor substrate with a capacitor to power the memory on detecting a drop in power supplied thereto. The capacitor stores just enough charge to power the memory while programming the NV memory portion of the NV memory cell with data from the RAM portion. In one preferred embodiment, the capacitor does not comprise a discrete element but is formed by intrinsic capacitance between elements of the integrated NV semiconductor memory.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed to a non-volatile semiconductor memory and method of operating the same that reduces the size of or eliminates entirely the need for an external capacitor to power the memory during an autostore operation.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

Briefly, the non-volatile (NV) semiconductor memory includes a plurality of memory cells each comprising a random access memory (RAM) portion for storing data in normal operating mode when the memory is powered by an external power supply, and a NV memory portion capable of storing data from the RAM portion when power is removed or drops below a predetermined level (power-down). Generally, the method begins with erasing the NV memory portion during normal operation before power is removed, and, on detecting a drop in power, programming the NV memory portion with data from the RAM portion while powering the memory from a capacitor. On restoration of power or power-up, data is recalled from the NV memory portion into the RAM portion, and the NV memory portion erased in preparation for the next programming step. Moving the erase step of the NV memory portion from power-down to the power-up stage significantly reduces the charge that must be supplied by the capacitor, thereby reducing the size of or eliminating entirely the need for an external capacitor.

A non-volatile semiconductor memory or device and methods of operating the same to reduce if not eliminate the need for an external capacitor will now be described in detail with reference to FIGS. 2 through 4. For purposes of clarity, many of the details of semiconductor fabrication that are widely known and are not relevant to the present invention have been omitted from the following description.

Figure 1:
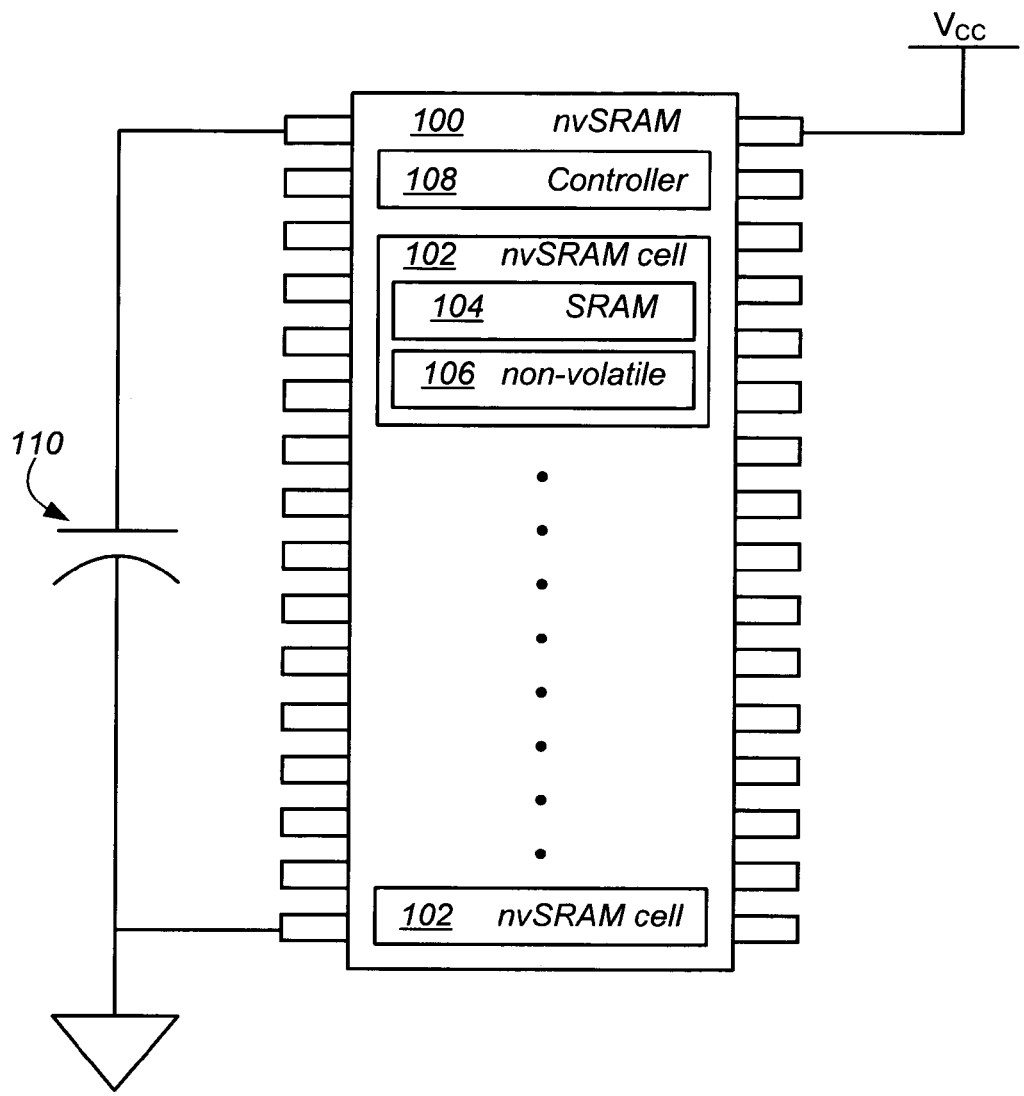
FIG. 1 is a schematic block diagram illustrating a conventional non-volatile (NV) random access memory (RAM)
Figure 2:
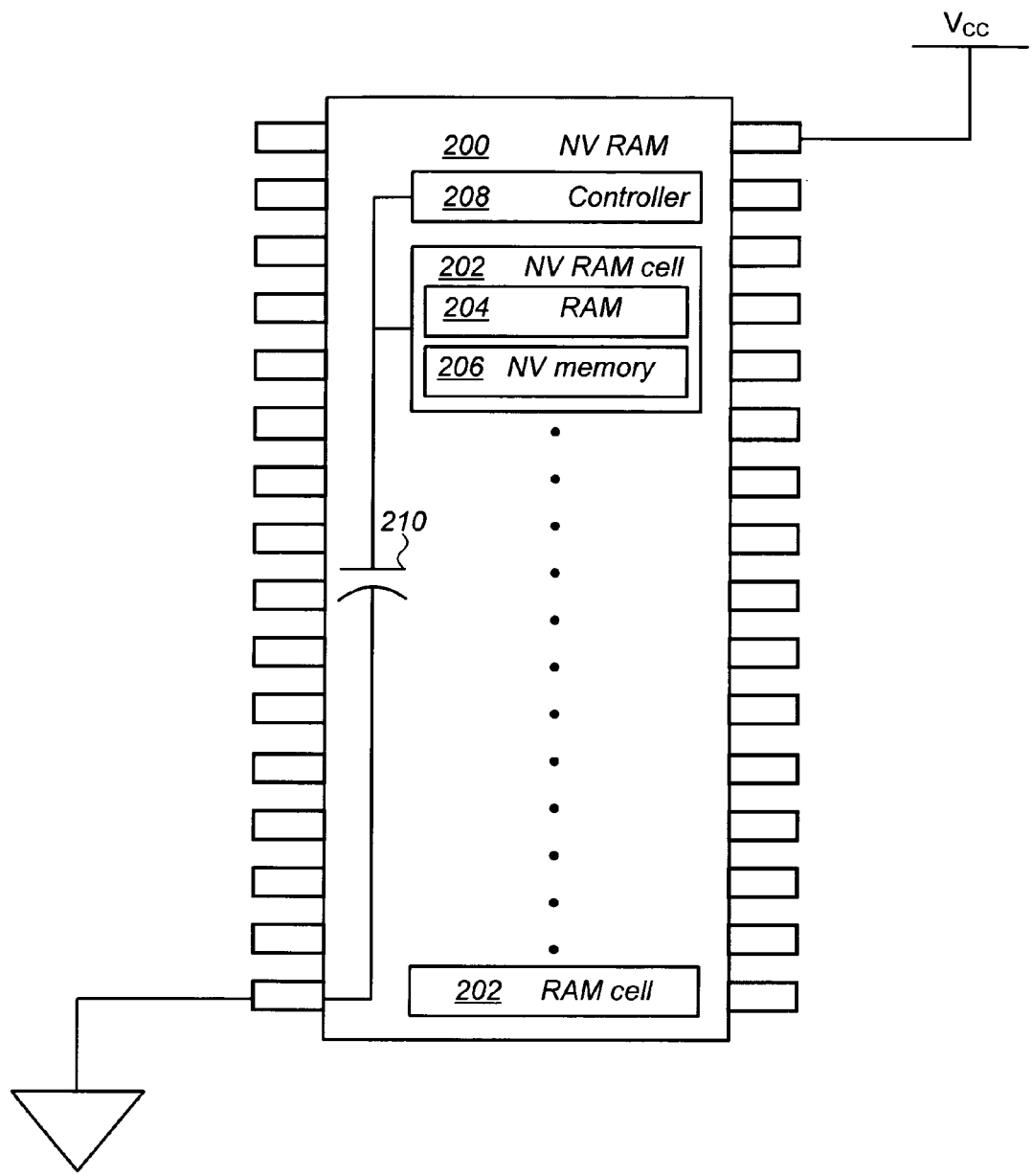
FIG. 2 is a schematic block diagram illustrating an NV RAM according to an embodiment of the present invention.

Referring to FIG. 2, the NV semiconductor memory 200 comprises a number of NV memory cells 202, each including a RAM portion 204 for storing data during normal operations when the memory is powered by an external power supply ($V_{CC}$) and a non-volatile or NV memory portion 206 including a number of charge storing transistors capable of retaining data after power from the external power supply is removed or drops below a predetermined level. Generally, as in the embodiment shown, the NV semiconductor memory 200 further includes control circuitry or a controller 208 to control erase, program, and recall or read operations of the NV memory portion 206.

In accordance with the present invention a capacitor 210 used during an autostore operation to program the NV memory portion 206 is substantially smaller than that required in memories operated according to conventional methods. By substantially smaller it is meant a capacitor 210 having a capacitance of from about one tenth to about one thousandth of that used in a conventional NV semiconductor memory. More preferably, the capacitor 210 has a capacitance of about one hundredth of that used in a conventional NV semiconductor memory, or from about 10 nanofarads (nF) to about 100 microfarads (μF) depending on the memory size.

In a preferred embodiment, as in that shown in FIG. 2, an external capacitor is replaced with a smaller internal capacitor 210 integrally formed on the same semiconductor substrate (not shown) or as part of the same integrated circuit (IC) as other elements of the NV semiconductor memory 200. Alternatively, the capacitor 210 can be eliminated entirely as a discrete element utilizing instead an intrinsic capacitance formed between elements of the NV semiconductor memory 200.

In one exemplary embodiment, the NV semiconductor memory 200 is a non-volatile static random access memory (nvSRAM), the RAM portion 204 comprising a number of static random access memory (SRAM) cells. Each SRAM cell includes a bi-stable SRAM latch, which, unlike dynamic RAM (DRAM), does not need to be periodically refreshed.

An nvSRAM memory cell according to an embodiment of the present invention will now be described in greater detail with reference to the schematic diagram of FIG. 3. For purposes of clarity, many of the details of nvSRAMs in general and SRAM architecture and operation in particular that are widely known and are not relevant to the present invention have been omitted from the following description.

Figure 3:
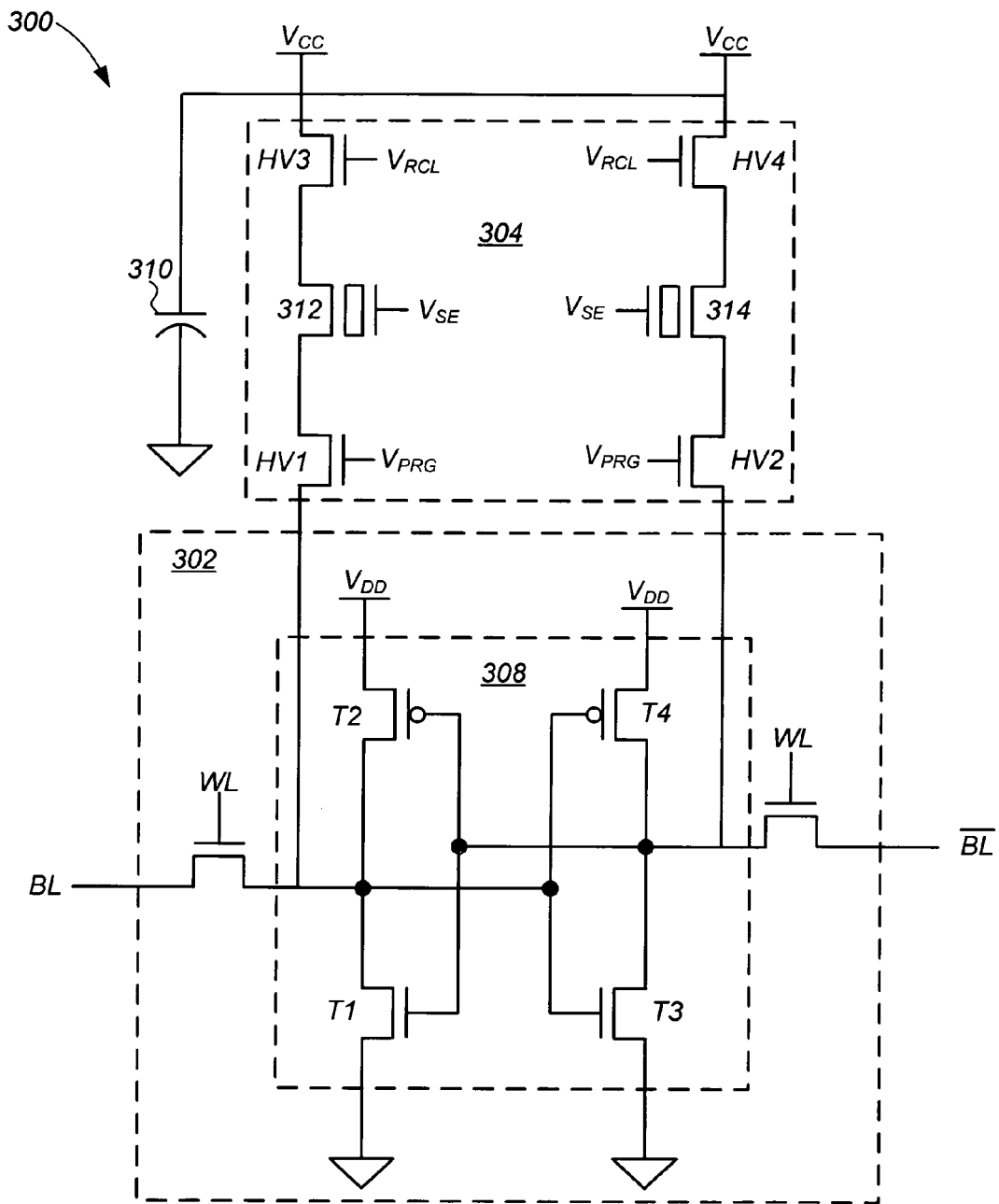
FIG. 3 is a schematic diagram illustrating cell of an NV RAM according to an embodiment of the present invention.
Figure 4:
FIG. 4 is a flow chart of a method for operating an NV RAM according to an embodiment of the present invention to reduce or eliminate a need for an external capacitor to supply power during an autostore operation.

Referring to FIG. 3, the memory cell 300 generally includes a SRAM portion or cell 302 for storing data during normal operations when the memory is powered by an external power supply ($V_{CC}$) and a non-volatile or NV memory portion 304 including a number of charge storing transistors capable of retaining data after power from the external power supply is removed. Also shown in this figure, but not constituting part of the memory cell 300, is a capacitor 306 coupled in parallel with $V_{CC}$ and used to program the NV memory portion 304 during an autostore operation. Alternatively, the capacitor can be correct connected through the controller (not shown in this figure).

In the embodiment shown the SRAM cell 302 is a six transistor (6T) cell, although it will be appreciated that cells that using fewer transistors are possible without departing from the scope of the present invention. Transistors T1-T4 form a pair of cross coupled inverters that form the bi-stable SRAM latch 308, and two switching transistors, T5 and T6, controlled by a wordline (WL) are used to connect bit lines (BL and BL-bar) to the SRAM cell 302 to transfer data for both read and write operations. The cross coupled inverters of the SRAM latch 308 reinforce each other enabling it to maintain the data stored therein as long as the SRAM cell 302 remains disconnected from the bitlines.

The NV memory portion 304 is coupled to the SRAM cell 302, and adapted to store a high or low state of the SRAM latch 308. The NV memory portion 304 includes at least first and second charge storing transistors 312, 314, coupled to the inverters of the bi-stable SRAM latch 308 to store thereof. Generally, the charge storing transistors 312, 314, of the NV memory portion 304 can comprise Oxide-Nitride-Oxide (ONO) dielectric gate stacks including a charge trapping or storing silicon-nitride layer between insulating oxide layers. Gate electrodes of the charge storing transistors 312, 314, coupled to a program/erase voltage ($V_{SE}$) generated by the memory controller (not shown in this figure). When a positive bias is applied to the gate electrodes of the charge storing transistors 312, 314, electrons from a channel region underlying the gate stack tunnel through a bottom oxide layer of the ONO stack and are trapped in the silicon-nitride layer, raising the threshold voltage ($V_T$) of the transistors, thereby programming the NV memory portion 304. Similarly, a negative bias or erase voltage applied to gates of the charge storing transistors 312, 314, removes the stored charge, lowering $V_T$ of the transistors and erasing the NV memory portion 304.

In a preferred embodiment, the charge storing transistors 312, 314, comprise Silicon-Oxide-Nitride-Oxide-Silicon (SONOS) dielectric gate stacks including one or more silicon-nitride or silicon-oxynitride charge storage or trapping layers. SONOS transistors including multi-layer charge storing layers are preferred for superior data retention, read and write speed, and improved device lifetime. SONOS transistors including multi-layer charge storing layers are described, for example, in co-pending, commonly assigned U.S. patent application Ser. No. 12/006,961, entitled "Oxynitride Bilayer Formed Using a Precursor Inducing a High Charge Trap Density in a Top Layer of the Bilayer," filed Jan. 8, 2008, which application is hereby incorporated by reference in its entirety.

The NV memory portion 304 further includes a high voltage store transistors, HV1-HV4, to configure the NV memory portion and couple it to the SRAM cell 302.

In particular, transistors HV1 and HV2 are controlled by programming voltage signal ($V_{PRG}$) and operate as switches to couple the charge storing transistors 312, 314, to the SRAM cell 302 during program and recall operations. Transistors HV3 and HV4 are controlled by a recall voltage signal ($V_{RCL}$) and operate to configure the NV memory portion 304 for a recall and operation by coupling it to the external power supply ($V_{CC}$) and decoupling it during an erase and programming operations.

A comparison of time and required capacitance for performing an autostore in a conventional memory using a conventional method as compared to a NV semiconductor memory operated according to an embodiment of the present invention will now be made with reference to FIG. 4. In particular, FIG. 4 illustrates erase and programming voltages applied to the NV memory portion of a conventional NV RAM during a conventional autostore operation. Referring to FIG. 4, when a drop in $V_{CC}$ is detected, time $t_0$, a negative bias or erase voltage ($-V_{pp}$) is applied to gates of the charge storing transistors in the NV memory portion to remove charge stored in the charging storing layers thereof, erasing the NV memory portion. The NV memory portion is then programmed by applying a programming voltage ($+V_{pp}$) to the gates of the charge storing transistors (312 and 314 in FIG. 3) and connecting the gates of transistors HV1 and HV2 ($V_{PRG}$ in FIG. 3) to $V_{DD}$ and the gates of transistors HV3 and HV4 ($V_{RCL}$ in FIG. 3) to ground.

To ensure that the NV memory portion has been completely erased prior to programming, the erase voltage must be applied for a predetermined period of time selected to remove substantially all of the charge stored in the charge storing transistors. Typically, the predetermined period of time for the erase step is from about 1 milliseconds (mS) to about 10 mS, or from about ten to about one hundred times a duration of the programming step. For example, in the embodiment shown the erase step lasts for 10 mS while the programming step is only 0.1 mS. In the conventional approach, the capacitor must be sufficiently large to supply power to the NV semiconductor memory, and in particular to supply power to the memory for both the erase and the programming steps. In contrast, to operate or perform an autostore in a NV semiconductor memory according to the present invention the capacitor needs to only have sufficient charge for the programming step, thereby enabling about a 100 times reduction in capacitor size. As noted above, this reduction in capacitor size enables the capacitor to be integrally formed on the same semiconductor substrate or as part of the same integrated circuit (IC) as other elements of the NV semiconductor memory, if not eliminated entirely as a discrete element.

A method operating an NV semiconductor memory comprising at least one NV memory cell including a RAM portion and a NV memory portion according to an embodiment of the present invention is now described with reference to the flowchart of FIG. 5.

Figure 5:
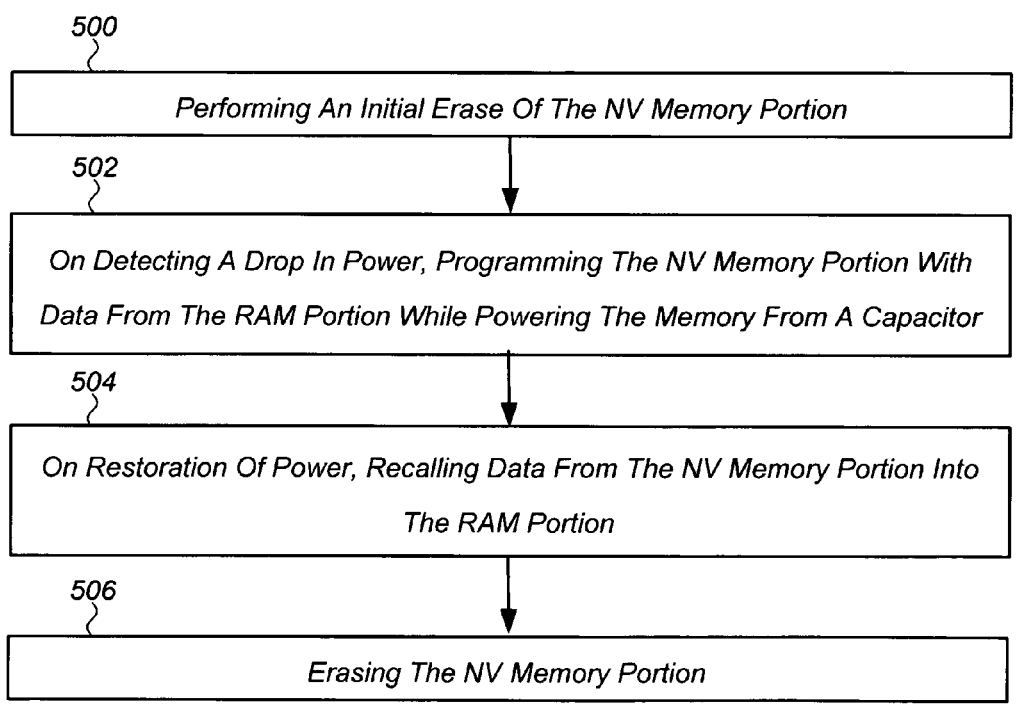
FIG. 5 is graph showing erase and programming voltages applied to a non-volatile memory portion of a conventional NV RAM during an autostore operation.

Referring to FIG. 5, the method begins with an initial erase of the NV memory portion (step 500). It will be appreciated that this initial erase can be performed by the manufacturer before shipping to a user, or by the user prior to operating the NV semiconductor memory in normal operating mode. Generally, where the NV memory portion includes a number of charge storage transistors this is accomplished by removing the charge stored therein. Next, on detecting a drop in power supplied to the NV semiconductor memory from the power supply, an autostore is initiated and the NV memory portion is programmed with data from the RAM portion while the NV semiconductor memory is powered from a capacitor (step 502). On restoration of power to the NV semiconductor memory from the power supply, data is recalled from the NV memory portion into the RAM portion (step 504), and the NV memory portion is erased in preparation for the next autostore operation (step 506). As noted above, the NV memory portion can be erased immediately following the recalling of data from the NV memory portion into the RAM portion or anytime thereafter prior to detecting another drop in power supplied to the NV semiconductor memory.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method of operating a non-volatile (NV) semiconductor memory comprising at least one NV memory cell including a random access memory (RAM) portion and a NV memory portion, the method comprising:
    initially erasing the NV memory portion; and
    in response to detecting a drop in power supplied to the NV semiconductor memory from a power supply, programming the NV memory portion of the NV memory cell with data from the RAM portion while powering the NV semiconductor memory from a capacitor, wherein the capacitor comprises intrinsic capacitance formed between elements of the NV semiconductor memory.

2. The method according to claim 1, wherein initially erasing the NV memory portion can be performed by a manufacturer prior to delivering the NV semiconductor memory to a user, or by the user.

3. The method according to claim 1, further comprising:
    in response to restoration of power to the NV semiconductor memory from the power supply, recalling data from the NV memory portion into the RAM portion; and
    erasing the NV memory portion.

4. The method according to claim 3, wherein erasing the NV memory portion is performed immediately following the recalling of data from the NV memory portion into the RAM portion.

5. The method according to claim 3, wherein erasing the NV memory portion is performed after a predetermined time following the recalling of data from the NV memory portion into the RAM portion and prior to detecting a drop in power supplied to the NV semiconductor memory from the power supply.

6. The method according to claim 1, wherein the NV semiconductor memory is an integrated NV semiconductor memory and wherein the capacitor is integrally formed on a substrate with the NV memory portion and RAM portion of the NV memory cell.

7. The method according to claim 1, wherein the NV semiconductor memory is an integrated NV semiconductor memory.

8. The method according to claim 1, wherein the NV memory portion comprises a number of charge storing transistors including a charge storage layer capable of retaining data after power has been removed.

9. The method according to claim 8, wherein at least one of the number of charge storing transistors comprise a floating gate transistor including a floating gate capable of retaining a charge after power has been removed.

10. The method according to claim 8, wherein at least one of the number of charge storing transistors comprise a Silicon-Oxide-Nitride-Oxide-Silicon (SONOS) dielectric gate stack including a charge storage layer.

11. A method of operating anon-volatile (NV) semiconductor memory comprising at least one NV memory cell including a random access memory (RAM) portion and a NV memory portion, the method:
  recalling data from the NV memory portion into the RAM portion;
  erasing the NV memory portion;
  in response to detecting a drop in power supplied to the NV semiconductor memory from a power supply, programming the NV memory portion of the NV memory cell with data from the RAM portion while powering the NV semiconductor memory from a capacitor;
  in response to restoration of power to the NV semiconductor memory from the power supply, recalling data from the NV memory portion into the RAM portion; and
  erasing the NV memory portion.

12. The method according to claim 11, wherein erasing the NV memory portion following the restoration of power is performed immediately following the recalling of data from the NV memory portion into the RAM portion.

13. The method according to claim 11, wherein erasing the NV memory portion following the restoration of power is performed after a predetermined time following the recalling of data from the NV memory portion into the RAM portion and prior to detecting a drop in power supplied to the NV semiconductor memory from the power supply.

14. The method according to claim 11, wherein the NV semiconductor memory is an integrated NV semiconductor memory and wherein the capacitor is integrally formed on a substrate with the NV memory portion and RAM portion of the NV memory cell.

15. The method according to claim 11, wherein the NV semiconductor memory is an integrated NV semiconductor memory and wherein the capacitor comprises intrinsic capacitance formed between elements of the integrated NV semiconductor memory.

16. The method according to claim 11, wherein the NV memory portion comprises a number of charge storing transistors including a charge storage layer capable of retaining data after power has been removed.

17. The method according to claim 16, wherein at least one of the number of charge storing transistors comprise a Silicon-Oxide-Nitride-Oxide-Silicon (SONOS) dielectric gate stack.

18. An integrated non-volatile (NV) semiconductor memory formed on a substrate, the memory comprising:
  at least one NV memory cell including a random access memory (RAM) portion and a NV memory portion;
  a capacitor; and
  a controller to power the NV semiconductor memory from the capacitor in response to detecting a drop in power supplied from a power supply to program the NV memory portion of the NV memory cell with data from the RAM portion, wherein the capacitor comprises intrinsic capacitance formed between elements of the integrated NV semiconductor memory.

19. The memory according to claim 18, wherein the NV memory portion comprises a number of charge storing transistors each with a Silicon-Oxide-Nitride-Oxide-Silicon (SONOS) dielectric gate stack.

* * * * *